United States Patent
Yasuda

(10) Patent No.: US 9,595,938 B2
(45) Date of Patent: Mar. 14, 2017

(54) ELASTIC WAVE DEVICE

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 14/190,413

(22) Filed: Feb. 26, 2014

(65) Prior Publication Data

US 2014/0176258 A1 Jun. 26, 2014

Related U.S. Application Data

(63) Continuation of application No. PCT/JP2012/071578, filed on Aug. 27, 2012.

(30) Foreign Application Priority Data

Sep. 1, 2011 (JP) ................. 2011-190341

(51) Int. Cl.
 *H03H 9/72* (2006.01)
 *H03H 7/46* (2006.01)
 *H03H 9/05* (2006.01)
 *H03H 7/42* (2006.01)

(52) U.S. Cl.
 CPC .............. *H03H 7/461* (2013.01); *H03H 7/42* (2013.01); *H03H 9/059* (2013.01); *H03H 9/725* (2013.01)

(58) Field of Classification Search
 CPC .. H03H 7/01; H03H 9/46; H03H 7/46; H03H 9/461; H03H 7/725

USPC ......... 333/133, 193–195; 257/700, 707, 712, 257/719
See application file for complete search history.

(56) References Cited

U.S. PATENT DOCUMENTS 6,351,194 B2 * 2/2002 Takahashi ...................... 174/262
7,135,944 B2 * 11/2006 Iwamoto ............. H03H 9/0028
  333/133
7,619,491 B2 * 11/2009 Takata ................. H03H 9/0576
  333/133

(Continued)

FOREIGN PATENT DOCUMENTS

CN 1513229 A 7/2004
CN 1708899 A 12/2005

(Continued)

OTHER PUBLICATIONS

Official Communication issued in International Patent Application No. PCT/JP2012/071578, mailed on Oct. 30, 2012.

(Continued)

*Primary Examiner* — Dinh T Le
(74) *Attorney, Agent, or Firm* — Keating & Bennett, LLP

(57) ABSTRACT

An elastic wave device includes elastic wave filters connected in parallel between an input and an output, and has reduced size and insertion loss, and improved electric power handling capability. An elastic wave filter chip is mounted on a die-attach surface of a wiring board and includes an input signal terminal and output signal terminals. At least one of the input and output signal terminals includes a plurality of signal terminals. A common connection wiring line to commonly connect the plurality of signal terminals of the elastic wave filter chip is provided in the wiring board.

21 Claims, 8 Drawing Sheets

(56) References Cited

U.S. PATENT DOCUMENTS

2004/0155730 A1    8/2004  Iwamoto et al.
2006/0044080 A1    3/2006  Hagiwara et al.
2009/0289740 A1*  11/2009  Takamine ............ H03H 9/0028
                                                      333/132

FOREIGN PATENT DOCUMENTS

EP    1 557 944 A1    7/2005
JP    2003-249842 A   9/2003

OTHER PUBLICATIONS

Official Communication issued in corresponding German Patent Application No. 11 2012 003 660.3, mailed on Dec. 5, 2014.

* cited by examiner

ELASTIC WAVE DEVICE

BACKGROUND OF THE INVENTION

1. Field of the Invention

The present invention relates to an elastic wave device using elastic waves such as surface acoustic waves or boundary acoustic waves, and more specifically to an elastic wave device having a structure in which an elastic wave filter chip is mounted on a die-attach surface of a wiring board.

2. Description of the Related Art

In recent years, a branching filter has been connected to an antenna of a cellular phone or the like to isolate signals transmitted and received by the antenna. As the branching filter, an elastic wave branching filter using elastic waves such as surface acoustic waves, boundary acoustic waves, or bulk acoustic waves has been widely used.

For example, Japanese Unexamined Patent Application Publication No. 2003-249842 discloses an example of this type of branching filter using elastic waves.

As illustrated in FIG. 13, a branching filter 1001 described in Japanese Unexamined Patent Application Publication No. 2003-249842 includes a common terminal 1002 connected to an antenna, a transmission terminal 1003, and a reception terminal 1004. A transmission surface acoustic wave filter 1005 is connected between the common terminal 1002 and the transmission terminal 1003. The transmission surface acoustic wave filter 1005 is a ladder surface acoustic wave filter in which the illustrated electrode structure is formed on a piezoelectric substrate.

A reception filter 1006 is connected between the common terminal 1002 and the reception terminal 1004. The reception filter 1006 includes longitudinally coupled resonator-type dual-mode surface acoustic wave filters 1007 and 1008. That is, the longitudinally coupled resonator-type dual-mode surface acoustic wave filters 1007 and 1008 are formed on a piezoelectric substrate. The longitudinally coupled resonator-type dual-mode surface acoustic wave filters 1007 and 1008 are connected to an input signal terminal 1009 by a common connection wiring line 1010. The input signal terminal 1009 is connected to the common terminal 1002 via a matching circuit 1011. Respective output terminals of the longitudinally coupled resonator-type dual-mode surface acoustic wave filters 1007 and 1008 are commonly connected to a signal terminal 1012. That is, the output terminals of the longitudinally coupled resonator-type dual-mode surface acoustic wave filters 1007 and 1008 are commonly connected to the signal terminal 1012 by a common connection wiring line 1013. The signal terminal 1012 is connected to the reception terminal 1004.

In the branching filter 1001 described in Japanese Unexamined Patent Application Publication No. 2003-249842, the reception filter 1006 has the two longitudinally coupled resonator-type dual-mode surface acoustic wave filters 1007 and 1008 connected in parallel between the input and output signal terminals. It is therefore possible to halve the aperture length of the surface acoustic wave filter, as compared with a structure in which a single longitudinally coupled resonator-type dual-mode surface acoustic wave filter is connected between the input and output terminals. Accordingly, it is possible to reduce the resistance value of electrode fingers to one quarter thereof, and thus to reduce the insertion loss. It is also possible to improve the electric power handling capability.

However, since the plurality of longitudinally coupled resonator-type dual-mode surface acoustic wave filters 1007 and 1008 are connected in parallel, as described in Japanese Unexamined Patent Application Publication No. 2003-249842, the input signal terminals and the output signal terminals are required to be commonly connected. It is therefore necessary to form the above-described common connection wiring lines 1010 and 1013 on the piezoelectric substrate of the reception filter 1006. Accordingly, the reception filter 1006 thus is undesirably increased in chip size.

SUMMARY OF THE INVENTION

Preferred embodiments of the present invention provide an elastic wave device which is configured to have a plurality of elastic wave filters connected in parallel between an input and an output, and which is capable of realizing a reduction in device size as well as a reduction in insertion loss and improvement of the electric power handling capability.

An elastic wave device according to a preferred embodiment of the present invention includes a wiring board including a die-attach surface and an elastic wave filter chip mounted on the die-attach surface of the wiring board. In the present preferred embodiment of the present invention, the elastic wave filter chip includes an input signal terminal, an output signal terminal, and a plurality of elastic filters connected in parallel between the input signal terminal and the output signal terminal, and at least one of the input signal terminal and the output signal terminal includes a plurality of signal terminals. A common connection wiring line for commonly connecting the plurality of signal terminals of the elastic wave filter chip is provided in the wiring board, and the plurality of signal terminals are commonly connected by the common connection wiring line.

In a specific aspect of the elastic wave device according to the present invention, the elastic wave filter chip is a reception filter chip, and the elastic wave device further includes a transmission filter chip mounted on the die-attach surface of the wiring board and formed by an elastic wave filter chip, to thereby form an elastic wave branching filter. In this case, it is possible to reduce the size of the reception filter chip, and thus to reduce the size of the elastic wave branching filter.

In another specific aspect of the elastic wave device according to the present invention, a ground electrode electrically connected to a terminal of the reception filter chip connected to a ground potential and a signal electrode connected to the transmission filter chip are provided on the die-attach surface of the wiring board. The ground electrode overlaps at least a part of the common connection wiring line and is located between the signal electrode and the common connection wiring line in a plan view. In this case, it is possible to improve the isolation characteristic between the transmission side and the reception side.

In a more limited aspect of the elastic wave device according to the present invention, the ground electrode is provided to extend outside an outer peripheral edge of the common connection wiring line in a portion in which the ground electrode overlaps the common connection wiring line in a plan view. In this case, it is possible to reduce variations in characteristic, even if misalignment occurs between the layers of the wiring board.

In still another specific aspect of the elastic wave device according to the present invention, the output signal terminal of the reception filter chip includes a plurality of signal terminals, and the plurality of signal terminals are commonly connected by the common connection wiring line provided in the wiring board.

In the elastic wave device of the present invention, the common connection wiring line is provided not in the elastic wave filter chip but in the wiring board. It is therefore possible to reduce the size of the elastic wave filter chip. With the configuration in which the plurality of elastic wave filters are connected in parallel between the input signal terminal and the output signal terminal, therefore, it is possible to realize a reduction in overall size of the elastic wave device including the elastic wave filter chip, as well as a reduction in insertion loss and improvement of the electric power handling capability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the drawings, specific preferred embodiments of the present invention will be described below to reveal the present invention.

Figure 1:
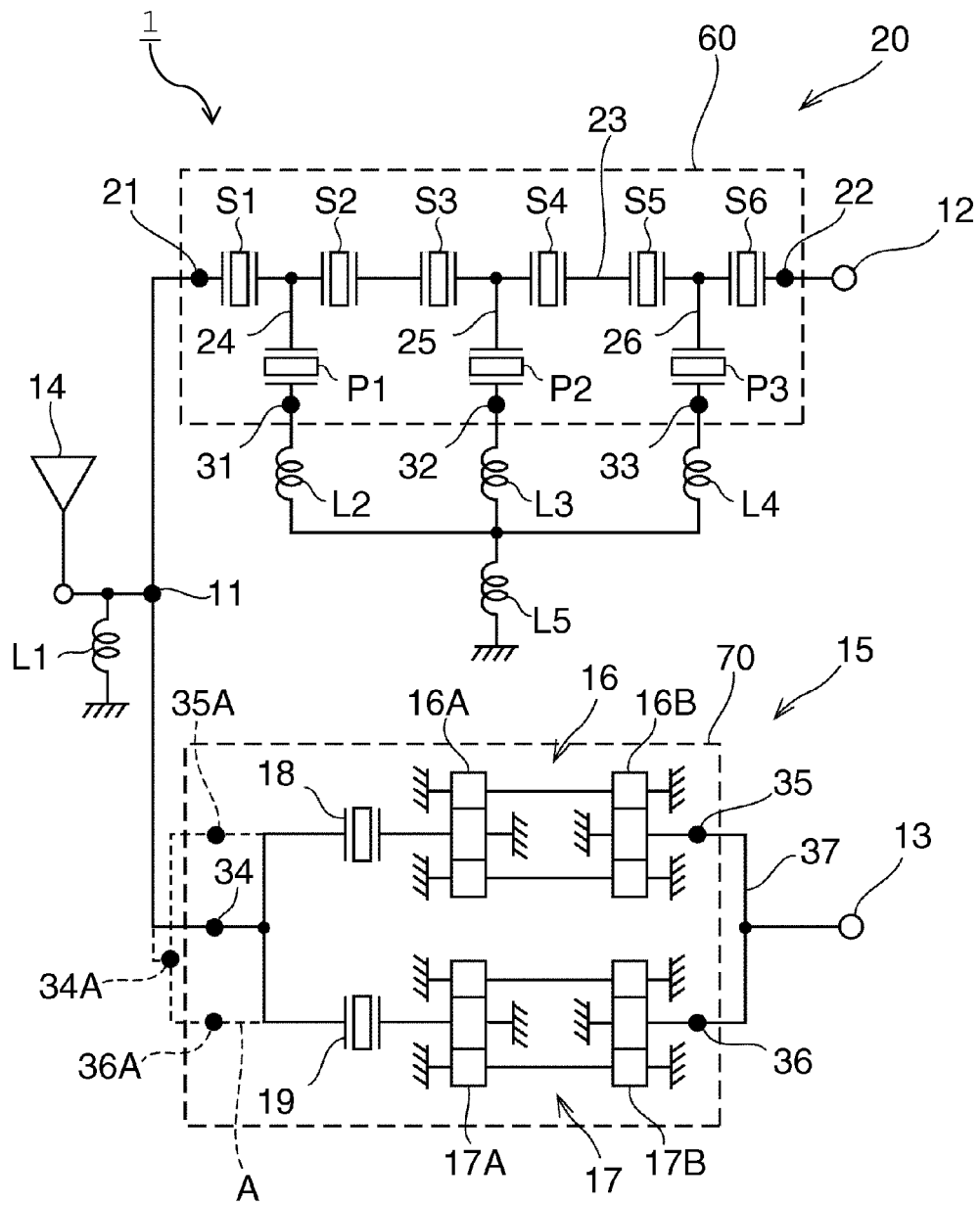
FIG. 1 is a schematic circuit diagram illustrating a circuit configuration of an elastic wave device according to a first preferred embodiment of the present invention.

FIG. 1 is a schematic circuit diagram of an elastic wave device according to a first preferred embodiment of the present invention. An elastic wave device 1 according to the present preferred embodiment is a surface acoustic wave branching filter preferably used in UMTS Band 8 of cellular phones, for example. In UMTS Band 8, the transmission frequency band ranges from 880 MHz to 915 MHz, and the reception frequency band ranges from 925 MHz to 960 MHz.

The elastic wave device 1 includes an antenna terminal 11, a transmission terminal 12, and a reception terminal 13. A reception filter unit 15 is connected between the antenna terminal 11 and the reception terminal 13. The reception filter unit 15 preferably includes a reception filter chip 70 indicated by a broken line.

Meanwhile, a transmission filter unit 20 is connected between the antenna terminal 11 and the transmission terminal 12. The transmission filter unit 20 includes a transmission filter chip 60 indicated by a broken line.

An external matching inductor L1 is connected between a ground potential and a connection point of the antenna terminal 11 and an antenna 14.

The transmission filter unit 20 includes a first signal terminal 21 connected to the antenna terminal 11 and a second signal terminal 22 connected to the transmission terminal 12. The first signal terminal 21 and the second signal terminal 22 are connected by a series arm 23. In the series arm 23, a plurality of series arm resonators S1 to S6 are connected in series. A plurality of parallel arms 24 to 26 are connected between the series arm 23 and a ground potential. The parallel arms 24 to 26 are respectively provided with parallel arm resonators P1 to P3.

Inductors L2 to L5 are externally connected to the transmission filter chip 60. More specifically, in the parallel arms 24 to 26, end portions of the parallel arm resonators P1 to P3 opposite to end portions thereof connected to the series arm are connected to ground terminals 31 to 33 provided to the transmission filter chip 60. The ground terminals 31 to 33 are respectively connected to ends of the inductors L2 to L4. That is, the inductors L2 to L4 are respectively connected in series with the parallel arm resonators P1 to P3. The other ends of the inductors L2 to L4 are commonly connected to one end of the inductor L5. The other end of the inductor L5 is connected to a ground potential.

As described above, the transmission filter unit 20 including the transmission filter chip 60 preferably has a ladder circuit configuration. Further, the series arm resonators S1 to S6 and the parallel arm resonators P1 to P3 described above preferably are surface acoustic wave resonators including interdigital transducer electrodes and disposed on a piezoelectric substrate, as described later. Therefore, the transmission filter chip 60 is an elastic wave filter chip.

The reception filter unit 15 includes a third signal terminal 34 defining and serving as an input signal terminal and fourth and fifth signal terminals 35 and 36 defining and serving as output signal terminals. That is, in the present preferred embodiment, the plurality of signal terminals 35 and 36 are provided on the output side.

A first longitudinally coupled resonator-type surface acoustic wave filter unit 16 is connected between the third signal terminal 34 and the fourth signal terminal 35. The first longitudinally coupled resonator-type surface acoustic wave filter unit 16 includes a first longitudinally coupled resonator-type surface acoustic wave filter unit 16A and a second longitudinally coupled resonator-type surface acoustic wave filter unit 16B cascade-connected to the first longitudinally coupled resonator-type surface acoustic wave filter unit 16A. The first longitudinally coupled resonator-type surface acoustic wave filter unit 16A includes three interdigital transducer electrodes disposed along the propagation direction of the surface acoustic waves and a pair of reflectors disposed on both sides of an area provided with the three interdigital transducer electrodes. The second longitudinally coupled resonator-type surface acoustic wave filter unit 16B has a similar configuration.

In FIG. 1, the three interdigital transducer electrodes in each of the first and second longitudinally coupled resonator-type surface acoustic wave filter units 16A and 16B are schematically illustrated as blocks. The illustration of the pair of reflectors is omitted.

An input terminal of the first longitudinally coupled resonator-type surface acoustic wave filter unit 16A is connected to the third signal terminal 34 via a one-port surface acoustic wave resonator 18. An output terminal of the second longitudinally coupled resonator-type surface acoustic wave filter unit 16B is connected to the fourth signal terminal 35.

Further, a second longitudinally coupled resonator-type surface acoustic wave filter unit 17 similarly includes first and second longitudinally coupled resonator-type surface acoustic wave filter units 17A and 17B. The first and second longitudinally coupled resonator-type surface acoustic wave filter units 17A and 17B are configured similarly to the first and second longitudinally coupled resonator-type surface acoustic wave filter units 16A and 16B.

An input terminal of the first longitudinally coupled resonator-type surface acoustic wave filter unit 17A is connected to the third signal terminal 34 via a one-port surface acoustic wave resonator 19. An output terminal of the second longitudinally coupled resonator-type surface acoustic wave filter unit 17B is connected to the fifth signal terminal 36.

Further, the fourth and fifth signal terminals 35 and are commonly connected to the reception terminal 13 by a common connection wiring line 37. As described later, the common connection wiring line 37 is provided not in the reception filter chip 70 but in a later-described wiring board.

Figure 2:
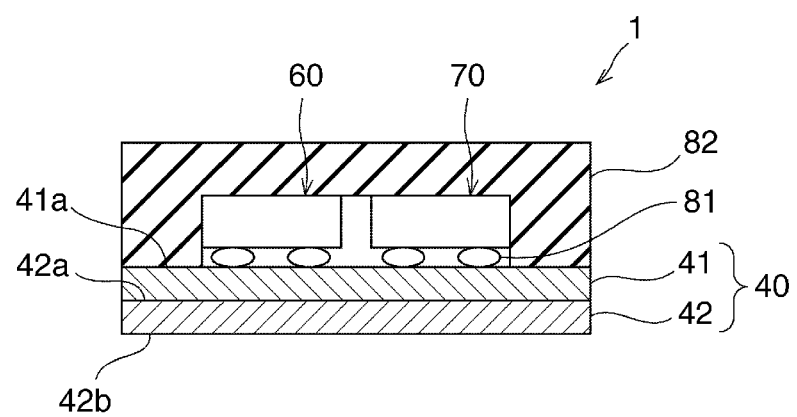
FIG. 2 is a schematic elevational cross-sectional view illustrating the structure of the elastic wave device according to the first preferred embodiment of the present invention.

FIG. 2 is a schematic cross-sectional view of the elastic wave device 1 according to the present preferred embodiment. As illustrated in FIG. 2, the elastic wave device 1 includes a wiring board 40. The wiring board 40 includes an upper layer 41 and a lower layer 42. The upper surface of the upper layer 41 is a die-attach surface 41a. Hereinafter, the upper surface of the lower layer 42, i.e., the interface between the upper layer 41 and the lower layer 42 will be referred to as an intermediate layer 42a, and the lower surface of the lower layer 42 will be referred to as a bottom surface 42b of the wiring board 40. The transmission filter chip 60 and the reception filter chip 70 are mounted on the die-attach surface 41a of the wiring board 40. The transmission filter chip 60 and the reception filter chip 70 are mounted on the wiring board 40 by bumps 81 in accordance with the flip-chip bonding method.

Further, a sealing resin layer 82 is arranged to cover the transmission filter chip 60 and the reception filter chip 70. As a result, the transmission filter chip 60 and the reception filter chip 70 are sealed.

Figure 3:
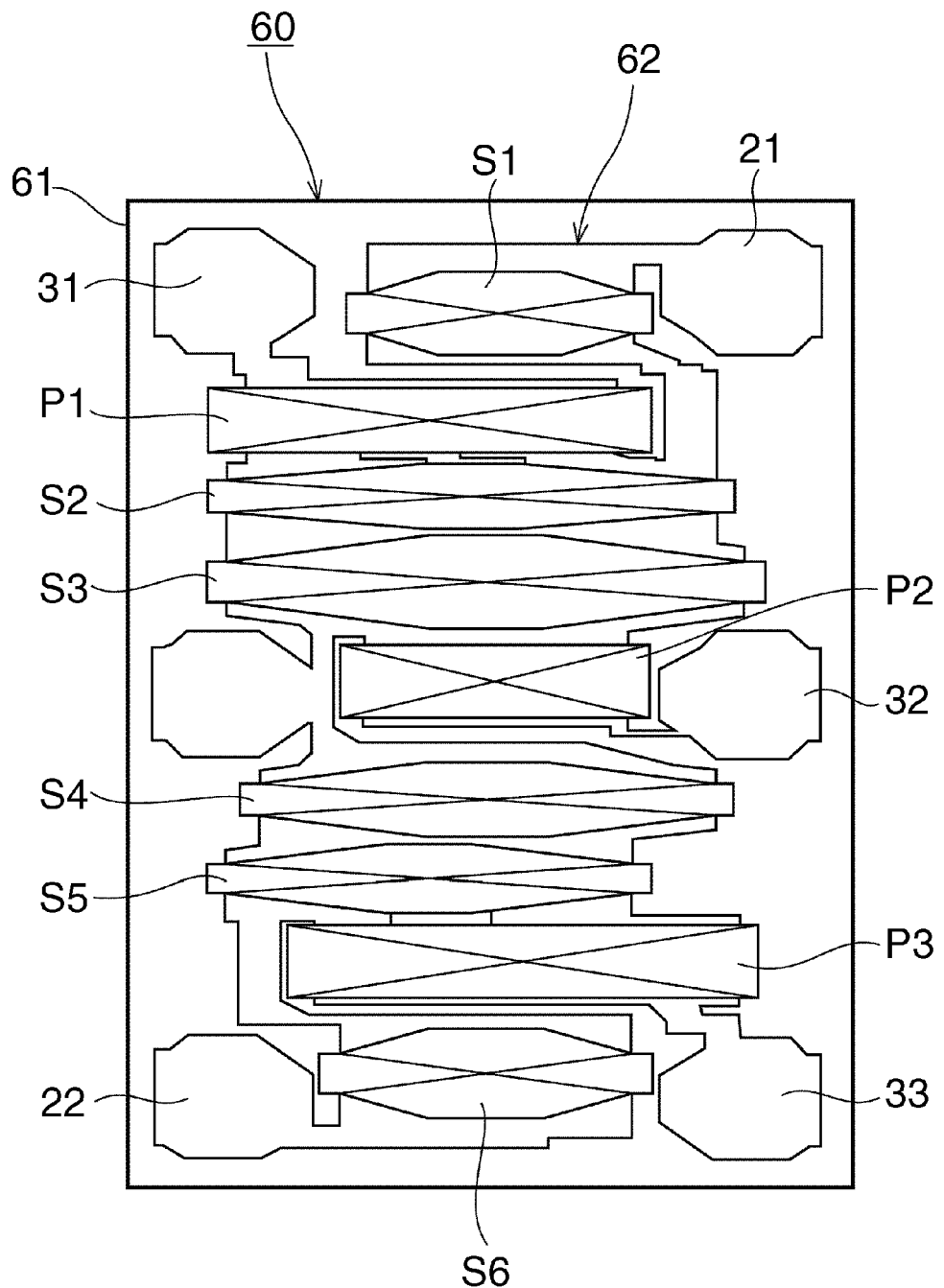
FIG. 3 is a schematic plan view illustrating an electrode structure on a transmission filter chip used in the elastic wave device according to the first preferred embodiment of the present invention.
Figure 4:
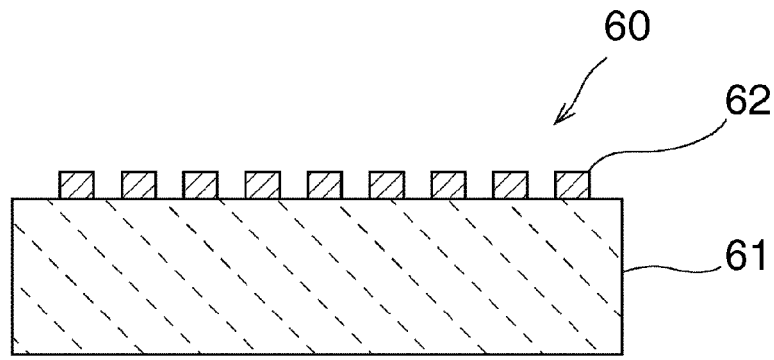
FIG. 4 is a schematic elevational cross-sectional view of the transmission filter chip used in the first preferred embodiment of the present invention.

FIG. 3 and FIG. 4 are respectively a schematic plan view and a schematic elevational cross-sectional view of the above-described transmission filter chip 60. The transmission filter chip 60 includes a piezoelectric substrate 61 and an electrode structure 62 located on the piezoelectric substrate 61. FIG. 3 illustrates details of the electrode structure 62. That is, the electrode structure 62 includes the interdigital transducer electrodes and the reflectors defining the series arm resonators S1 to S6 and the parallel arm resonators P1 to P3 described above. The electrode structure 62 further includes the series arm 23, the parallel arms 24 to 26, the first and second signal terminals 21 and 22, and the first to third ground terminals 31 to 33 described above.

Figure 5:
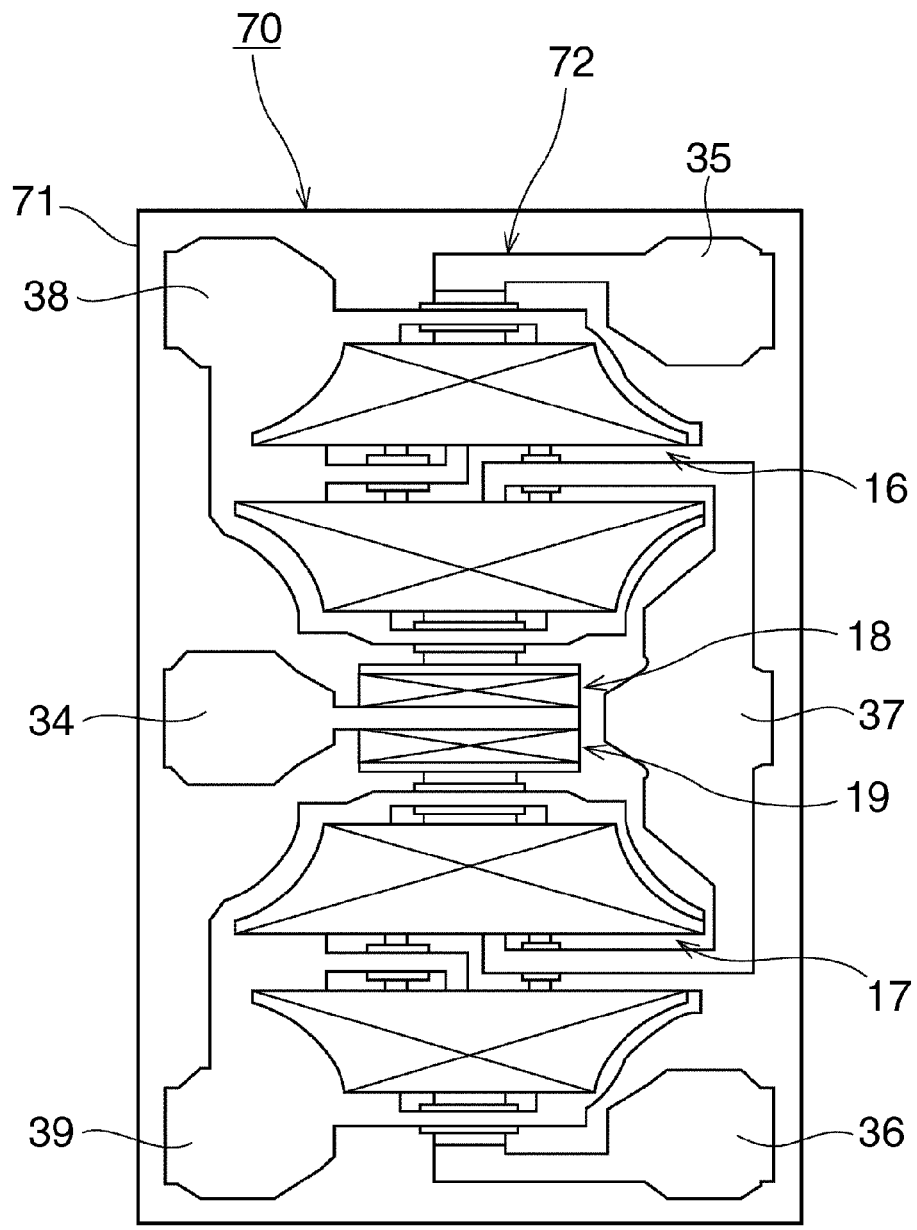
FIG. 5 is a schematic plan view for illustrating an electrode structure on a reception filter chip used in the first preferred embodiment of the present invention.

FIG. 5 is a schematic plan view of the reception filter chip 70. The reception filter chip 70 includes an electrode structure 72 located on a piezoelectric substrate 71. The electrode structure 72 includes the interdigital transducer electrodes and the reflectors defining the first and second filter units 16 and 17 and the one-port surface acoustic wave resonators 18 and 19 described above. The electrode structure 72 further includes the above-described third to fifth signal terminals 34 to 36, fourth to sixth ground terminals 37 to 39, and wiring lines connecting these elements.

As described above, in the present preferred embodiment, the fourth signal terminal 35 and the fifth signal terminal 36 are not commonly connected by a common connection wiring line on the piezoelectric substrate 71. Therefore, such a common connection wiring line is not required to be provided on the piezoelectric substrate 71. Accordingly, it is possible to reduce the size of the reception filter chip 70.

The piezoelectric substrates 61 and 71 may be made of an appropriate piezoelectric material. $LiNbO_3$, $LiTaO_3$, crystal, or the like, for example, may be used as such a piezoelectric material.

The electrode structures 62 and 72 may be made of an appropriate metal. Al, Pt, Au, Ag, Cu, Ni, Ti, Cr, Pd, or an alloy thereof, for example, may be used as such a metal. Further, electrodes defining the electrode structures 62 and 72 may be defined by a lamination of a plurality of metal layers made of the above-described metal or alloy.

With reference to FIGS. 6 to 9, details of the above-described wiring board 40 will now be described.

Figure 6:
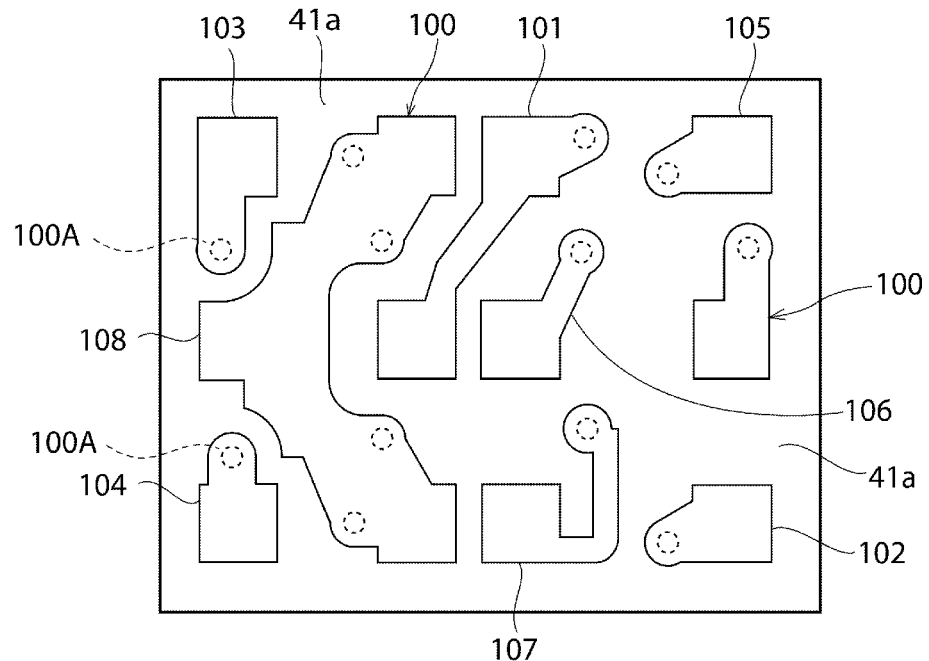
FIG. 6 is a schematic plan view illustrating an electrode structure on a die-attach surface of a wiring board used in the first preferred embodiment of the present invention.
Figure 7:
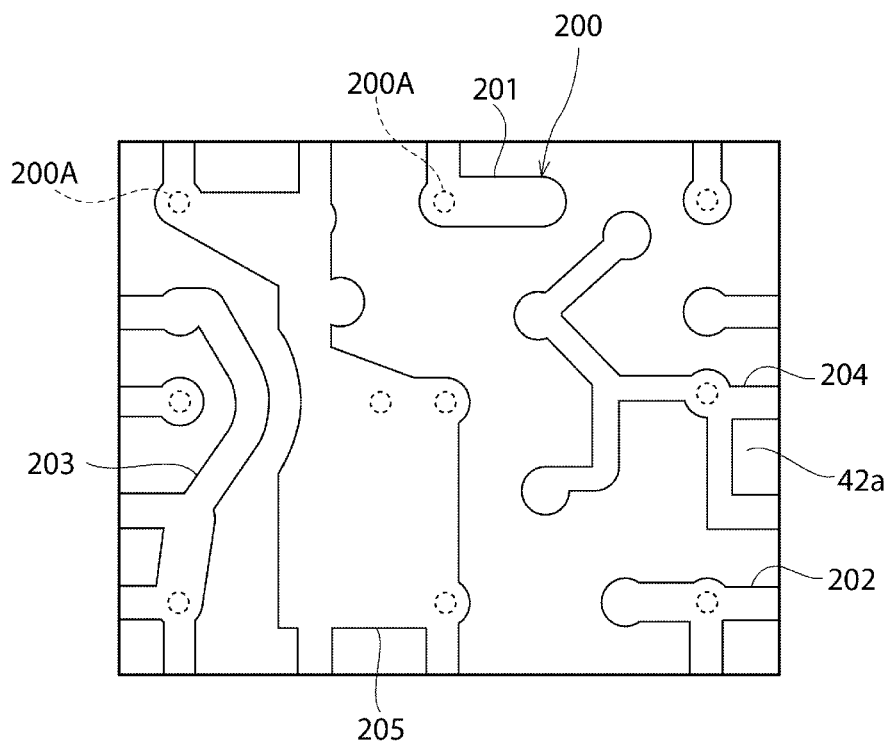
FIG. 7 is a schematic plan view illustrating an electrode structure provided on an intermediate layer of the wiring board used in the first preferred embodiment of the present invention.
Figure 8:
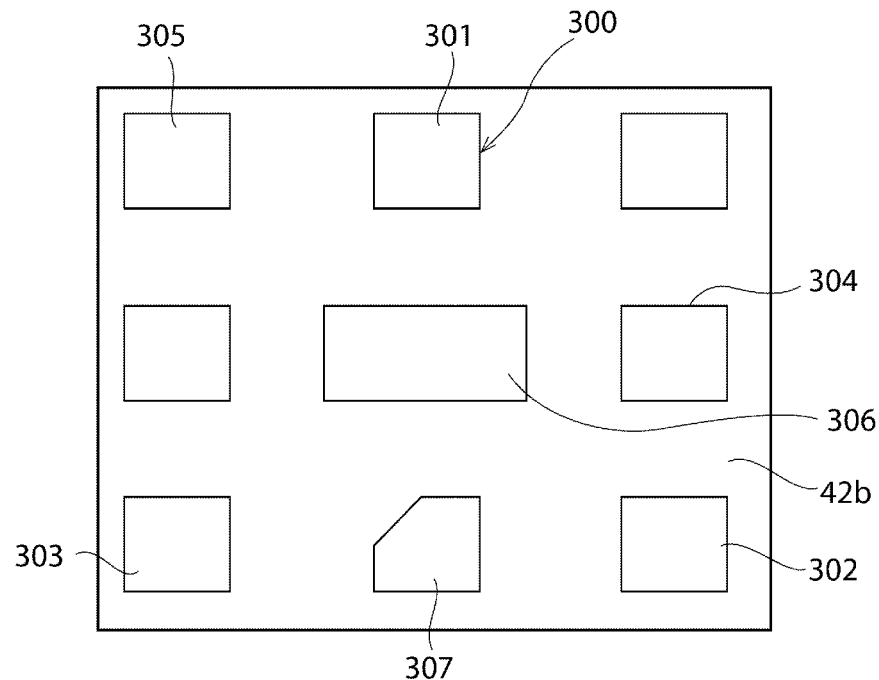
FIG. 8 is a schematic plan view for illustrating electrode shapes on a bottom surface of the wiring board used in the first preferred embodiment of the present invention.

FIG. 6 is a plan view illustrating an electrode structure on the upper surface of the wiring board 40, i.e., the die-attach surface 41a. FIG. 7 is a schematic plan view illustrating an electrode structure provided on the intermediate layer 42a of the wiring board 40. FIG. 8 is a plan view schematically illustrating electrode shapes provided on the bottom surface 42b of the wiring board 40.

As illustrated in FIG. 6, an electrode structure 100 is provided on the die-attach surface 41a of the wiring board 40. The electrode structure 100 includes an antenna electrode 101 connected to an antenna, a transmission electrode 102, first and second reception electrodes 103 and 104, and first to fourth ground electrodes 105 to 108. The transmission filter chip 60 and the reception filter chip 70 are electrically connected to the electrode structure 100 via the above-described bumps 81.

More specifically, the first signal terminal 21 of the transmission filter chip 60 is connected to the antenna electrode 101. The second signal terminal 22 is connected to the transmission electrode 102. The first ground terminal 31 is connected to the first ground electrode 105. The second ground terminal 32 is connected to the second ground electrode 106. The third ground terminal 33 is connected to the third ground electrode 107.

Meanwhile, the third signal terminal 34 of the reception filter chip 70 is connected to the antenna electrode 101. The fourth signal terminal 35 is connected to the first reception electrode 103. The fifth signal terminal 36 is connected to the second reception electrode 104. The fourth to sixth ground terminals 37 to 39 are connected to the fourth ground electrode 108.

As illustrated in FIG. 7, an electrode structure 200 is provided on the intermediate layer 42a. The electrode structure 200 includes an antenna internal electrode 201, a transmission internal electrode 202, a reception internal electrode 203, and first and second ground internal electrodes 204 and 205. The electrode structure 200 is connected as appropriate to the electrodes of the electrode structure 100 by via hole electrodes 100A. More specifically, the antenna internal electrode 201 is connected to the antenna electrode 101. The transmission internal electrode 202 is connected to the transmission electrode 102. The reception internal electrode 203 is connected to the first and second reception electrodes 103 and 104. The first ground internal electrode 204 is connected to the first to third ground electrodes 105 to 107. The second ground internal electrode 205 is connected to the fourth ground electrode 108.

The above-described reception internal electrode 203 corresponds to the above-described common connection wiring line 37. That is, the reception internal electrode 203 is provided in the wiring board 40, and commonly connects the fourth signal terminal 35 and the fifth signal terminal 36 described above.

Further, the first ground internal electrode 204 is connected to the first to third ground electrodes 105 to 107. As a result, the parallel arms 24 to 26 are commonly connected.

As illustrated in FIG. 8, the bottom surface 42b of the wiring board 40 is provided with an electrode structure 300. The electrode structure 300 includes an antenna external terminal 301, a transmission external terminal 302, a reception external terminal 303, and first to fourth ground external terminals 304 to 307. The electrode structure 300 is electrically connected to the electrodes of the electrode structure 200 through via hole electrodes 200A schematically indicated by broken lines in FIG. 7. More specifically, the antenna external terminal 301 is connected to the antenna internal electrode 201. The transmission external terminal 302 is connected to the transmission internal electrode 202. The reception external terminal 303 is connected to the reception internal electrode 203. The first ground external terminal 304 is connected to the first ground internal electrode 204. The second to fourth ground external terminals 305 to 307 are connected to the second ground internal electrode 205.

Herein, the first to third ground electrodes 105 to 107, the first ground internal electrode 204, the first ground external terminal 304, and the via hole electrodes 100A and 200A connecting these elements define the above-described inductors L2 to L5. That is, in the present preferred embodiment, the above-described inductors L2 to L5, which are externally attached to the transmission filter chip 60, are provided by the use of the above-described wiring board 40. Therefore, the inductors L2 to L5 do not require inductor components other than the wiring board 40 and the transmission filter chip 60. Also for this reason, it is possible to reduce the number of components and the size of the elastic wave device 1.

Figure 9:
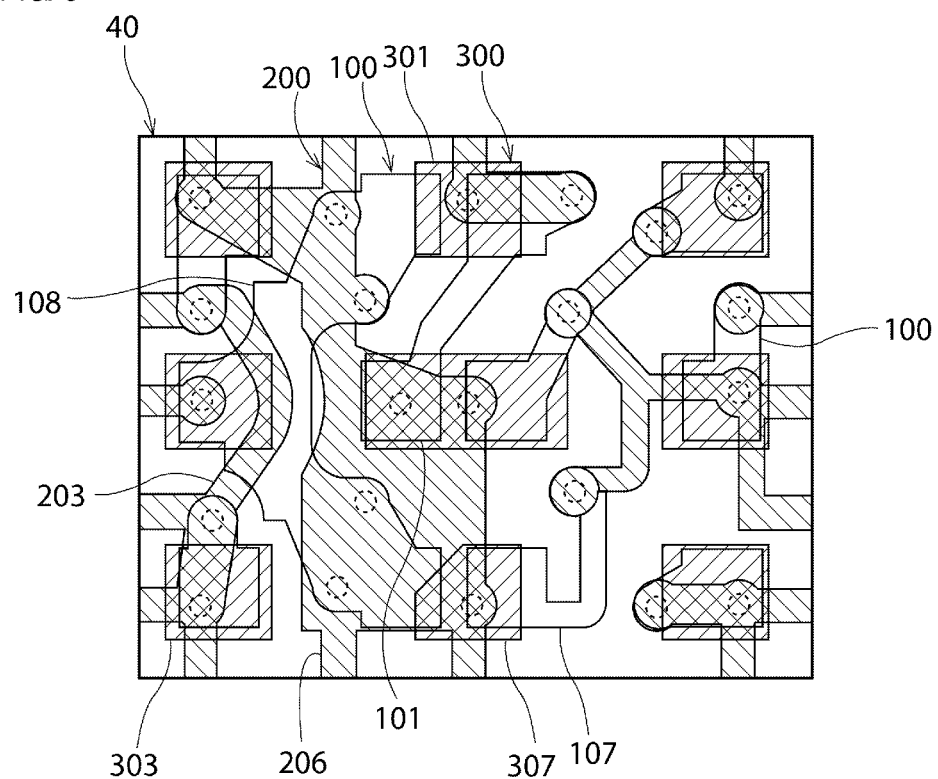
FIG. 9 is a schematic plan view illustrating an overlapping state of electrodes on respective layers of the wiring board in a branching filter according to the first preferred embodiment of the present invention.

FIG. 9 is a schematic plan view illustrating an overlapping state of the above-described electrodes provided on the die-attach surface 41a, the intermediate layer 42a, and the bottom surface 42b of the wiring board 40. In FIG. 9, the electrode structure 100 provided on the die-attach surface 41a is not hatched. Further, the electrode structure 200 located on the intermediate layer 42a is hatched with diagonal lines. Furthermore, the electrode structure 300 located on the bottom surface 42b is hatched with diagonal lines different in direction from those of the electrode structure 200.

As illustrated in FIG. 9, in a plan view of the wiring board 40, the fourth ground electrode 108 located on the above-described die-attach surface 41a partially overlaps the reception internal electrode 203 located on the intermediate layer 42a. In addition, the fourth ground electrode 108 is located between the antenna electrode 101 on the die-attach surface 41a and the reception internal electrode 203. It is therefore possible to restrict unnecessary signal leakage from the antenna electrode 101 to the reception internal electrode 203 via a parasitic capacitance. Accordingly, it is possible to improve the isolation characteristic between the transmission side and the reception side.

A second preferred embodiment of the present invention will now be described. An elastic wave device according to the second preferred embodiment is similar to that of the first preferred embodiment except for the wiring board. Therefore, description of the transmission filter chip 60, the reception filter chip 70, and the connection structure of the wiring board, the transmission filter chip 60, and the reception filter chip 70 will be omitted by referring to the description given in the first preferred embodiment.

Figure 10:
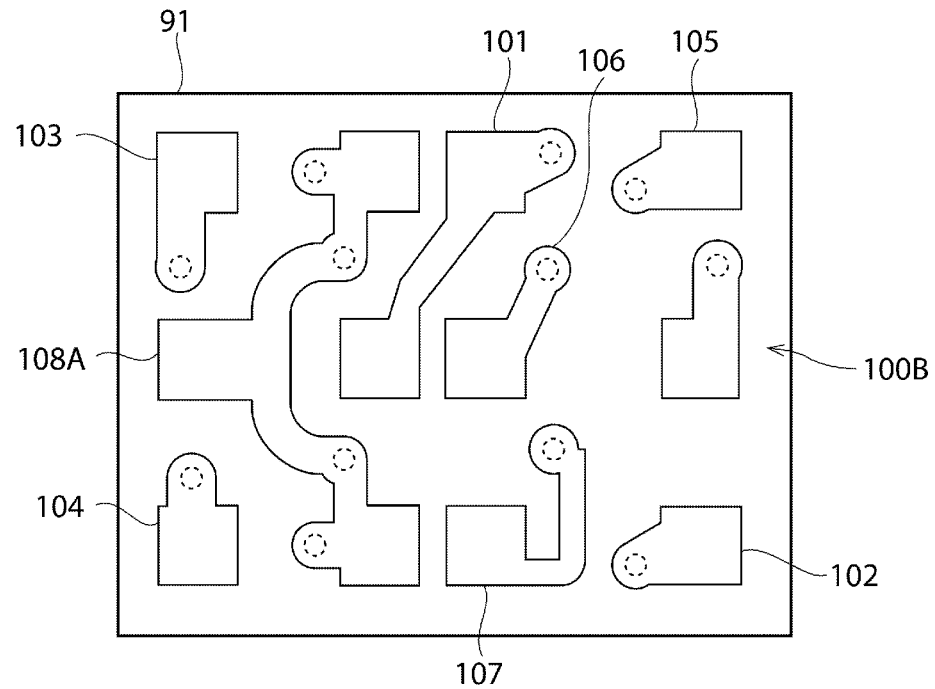
FIG. 10 is a schematic plan view illustrating an electrode structure on a die-attach surface of a wiring board used in a branching filter according to a second preferred embodiment of the present invention.

FIG. 10 is a schematic plan view illustrating an electrode structure 100B on a die-attach surface of a wiring board 91 used in the second preferred embodiment. In the electrode structure 100B, a fourth ground electrode 108A is smaller in area than the fourth ground electrode 108 of the first preferred embodiment. The electrode structure 100B is otherwise similar to the electrode structure 100. Therefore, the same elements are designated by the same reference numerals.

Figure 11:
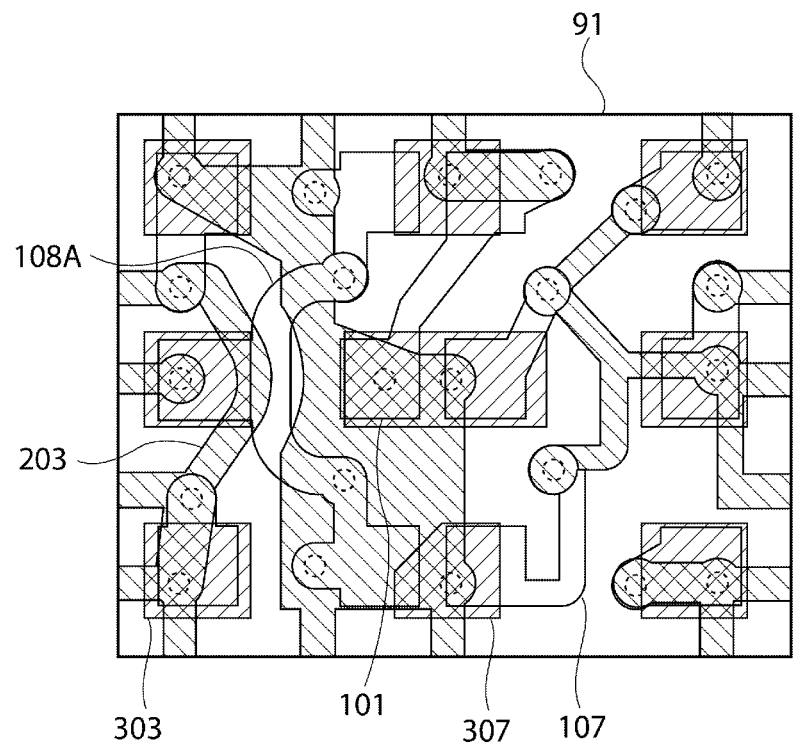
FIG. 11 is a schematic plan view illustrating an overlapping state of electrodes on respective layers of the wiring board in the second preferred embodiment of the present invention.

Respective electrode structures on an intermediate layer and a bottom surface of the wiring board 91 are similar to those of the first preferred embodiment. FIG. 11 is a schematic plan view illustrating an overlapping state of the electrode structures on the die-attach surface, the intermediate layer, and the bottom surface of the wiring board 91 in the second preferred embodiment. As seen in FIG. 11, the fourth ground electrode 108A partially overlaps the reception internal electrode 203 also in the present preferred embodiment. Further, the fourth ground electrode 108A is interposed between the antenna electrode 101 and the reception internal electrode 203. Therefore, it is also possible in the present preferred embodiment to improve the isolation characteristic between the transmission side and the reception side.

Figure 12:
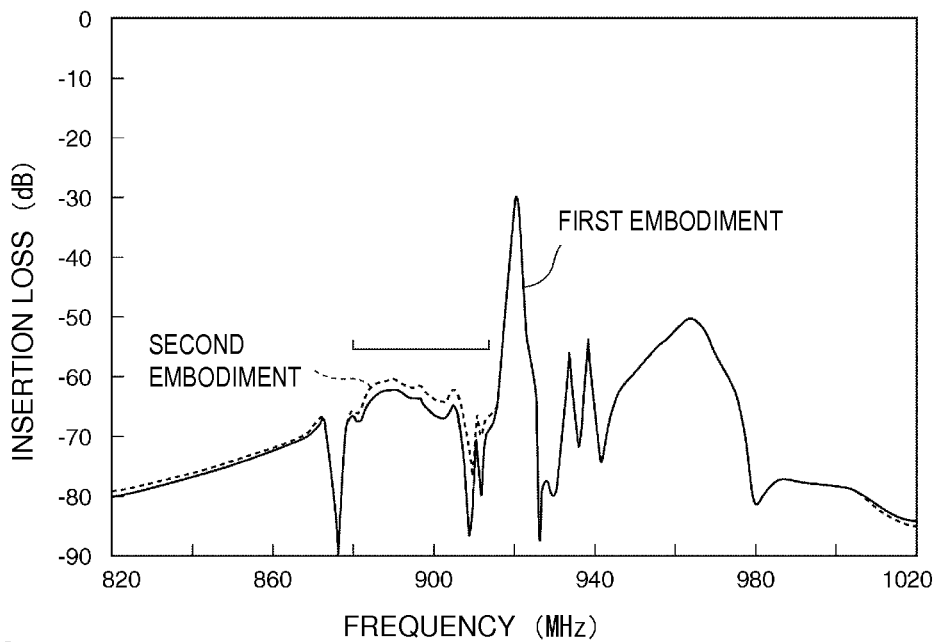
FIG. 12 is a diagram illustrating attenuation-frequency characteristics of reception filters of elastic wave devices according to the first and second preferred embodiments.
Figure 13:
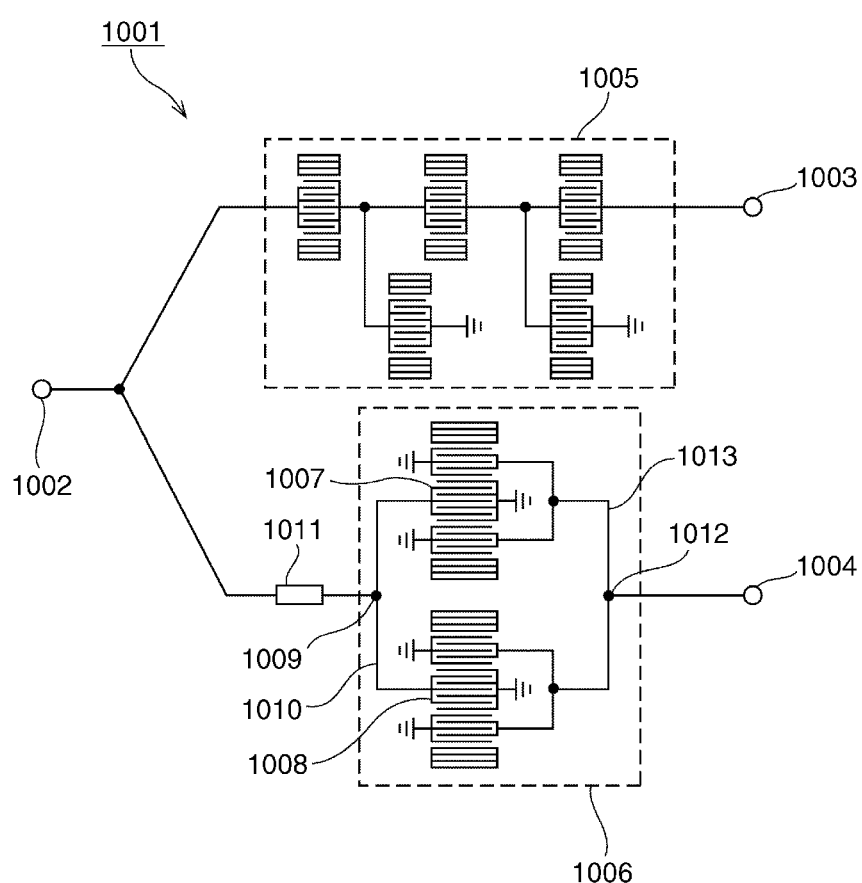
FIG. 13 is a circuit diagram illustrating an example of an existing branching filter.

FIG. 12 is a diagram illustrating the isolation characteristics between the transmission side and the reception side in the respective elastic wave devices according to the first and second preferred embodiments, in which a solid line indicates the result of the first preferred embodiment and a broken line indicates the result of the second preferred embodiment. Also in the second preferred embodiment, the isolation characteristic in the transmission frequency band, i.e., which preferably ranges from 880 MHz to 915 MHz, is more than about 60 db, exceeding the isolation standard of 55 db. However, the isolation characteristic is more improved in the first preferred embodiment than in the second preferred embodiment. This is considered to be because the overlapping area of the fourth ground electrode 108 and the reception internal electrode 203 defining and serving as a common connection wiring line is larger in the first preferred embodiment than in the second preferred embodiment. It is therefore preferable that the overlapping area of the fourth ground electrode and the reception internal electrode, i.e., the common connection wiring line, is large.

In addition, if the overlapping area of the fourth ground electrode and the reception internal electrode is increased, it is possible to reduce variations in characteristics, even if lamination misalignment occurs between the electrode layers in the wiring board.

Preferably, therefore, it is desirable that, in a plan view, the fourth ground electrode 108 or 108A extends outside the outer edge of the reception internal electrode 203 in the portion in which the fourth ground electrode 108 or 108A overlaps the reception internal electrode 203 defining and serving as a common connection wiring line.

In the above-described first and second preferred embodiments, the output signal terminals of the reception filter chip 70 in FIG. 1 are the fourth signal terminal 35 and the fifth signal terminal 36, and the common connection wiring line commonly connecting the fourth signal terminal 35 and the fifth signal terminal 36 is provided outside the reception filter chip 70. Meanwhile, on the input side of the reception filter chip 70, the respective input terminals of the one-port surface acoustic wave resonators 18 and 19 are commonly connected to the third signal terminal 34. Alternatively, as indicated by broken lines A in FIG. 1, the input terminal of the one-port surface acoustic wave resonator 18 and the one-port surface acoustic wave resonator 19 may be connected to a sixth signal terminal 35A and a seventh signal terminal 36A, respectively, and the sixth and seventh signal terminals 35A and 36A on the input side may be commonly connected by a common connection wiring line outside the reception filter chip 70. That is, a third signal terminal 34A and the common connection wiring line may be provided on the wiring board.

As described above, according to various preferred embodiments of the present invention, in at least one of the plurality of input signal terminals and the plurality of output signal terminals of the reception filter chip 70, the plurality of signal terminals may be commonly connected by the common connection wiring line provided on the wiring board outside the reception filter chip 70. With this configuration, there is no need to provide the common connection wiring line on the reception filter chip 70, and thus it is possible to reduce the size of the reception filter chip 70. Preferably, therefore, it is desirable to remove the common connection wiring line from the reception filter chip 70 and provide the common connection wiring line on the wiring board on both the input side and the output side.

Further, in the first and second preferred embodiments, the reception filter chip 70 includes the longitudinally coupled resonator-type surface acoustic wave filter units 16 and 17 using the surface acoustic waves. The reception filter chip 70, however, may be provided by elastic filters using boundary acoustic waves or bulk acoustic waves, not limited to the surface acoustic waves.

The transmission filter chip 60 may also be provided by elastic wave elements using boundary acoustic waves or bulk acoustic waves.

Further, in the above-described preferred embodiments, the plurality of signal terminals are commonly connected by the common connection wiring line provided on the wiring board in at least one of the plurality of input signal terminals and the plurality of output signal terminals of the reception filter chip in the elastic wave branching filter. That is, the plurality of signal terminals of the reception filter chip defined by an elastic wave filter chip are commonly connected by the common connection wiring line provided on the wiring board. Such a configuration according to various preferred embodiments of the present invention is not limited to the structure in which the elastic wave filter chip defining the reception filter of the elastic wave branching filter is mounted on the wiring board. That is, preferred embodiments of the present invention are widely applicable to elastic wave devices in which an elastic wave filter chip including a plurality of signal terminals on the input side and/or the output side is mounted on a wiring board, and which is configured to commonly connect the plurality of signal terminals.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a wiring board including a die-attach surface; and
an elastic wave filter chip mounted on the die-attach surface of the wiring board; wherein
the elastic wave filter chip includes an input, an output, and a plurality of elastic wave filters connected between the input and the output; wherein
the input includes one input signal terminal that connects the plurality of elastic wave filters together in parallel within the elastic wave filter chip; and
the output includes a plurality of output signal terminals each connected to a respective one of the plurality of elastic wave filters;
a common connection wiring line is provided on or in the wiring board and outside of the elastic wave filter chip; wherein
the common connection line commonly connects, in parallel, the plurality of output signal terminals outside of the elastic wave filter chip.

2. The elastic wave device described in claim 1, wherein the elastic wave filter chip is a reception filter chip, and the elastic wave device further comprises a transmission filter chip mounted on the die-attach surface of the wiring board and including an elastic wave filter chip to define an elastic wave branching filter.

3. The elastic wave device described in claim 2, wherein a ground electrode electrically connected to a terminal of the reception filter chip connected to a ground potential and a signal electrode connected to the transmission filter chip are provided on the die-attach surface of the wiring board, and the ground electrode overlaps at least a portion of the common connection wiring line and is located between the signal electrode and the common connection wiring line in a plan view.

4. The elastic wave device described in claim 3, wherein the ground electrode extends outside an outer peripheral edge of the common connection wiring line in a portion in which the ground electrode overlaps the common connection wiring line in a plan view.

5. The elastic wave device described in claim 2, wherein the output signal terminal of the reception filter chip includes a plurality of signal terminals, and the plurality of signal terminals are commonly connected by the common connection wiring line provided in the wiring board.

6. The elastic wave device described in claim 1, wherein the elastic wave device is a surface acoustic wave branching filter.

7. The elastic wave device described in claim 1, further comprising an antenna terminal, a transmission terminal, a reception terminal, a reception filter unit connected between the antenna terminal and the reception terminal, and a transmission filter unit connected between the antenna terminal and the transmission terminal, wherein the elastic wave filter chip is included in at least one of the reception filter unit and the transmission filter unit.

8. The elastic wave device described in claim 7, wherein the transmission filter unit includes a first signal terminal, a second signal terminal, a series arm including a plurality of series arm resonator connected in series and connecting the first signal terminal and the second signal terminal, and a plurality of parallel arms connected between the series arm and a ground.

9. The elastic wave device described in claim 7, wherein the reception filter unit includes a plurality of signal terminals defining an input signal terminal and output signal terminals, a first longitudinally coupled resonator surface acoustic wave filter unit connected between two of the plurality of signal terminals, and a second longitudinally coupled resonator surface acoustic wave filter unit connected between two of the plurality of signal terminals.

10. The elastic wave device described in claim 1, wherein the wiring board includes an upper layer and a lower layer, and an upper surface of the upper layer defines the die-attach surface.

11. The elastic wave device described in claim 1, further comprising a sealing layer arranged to cover the elastic wave filter chip on the die-attach surface of the wiring board.

12. The elastic wave device described in claim 1, further comprising another elastic wave filter chip mounted on the die-attach surface of the wiring board, wherein the elastic wave filter chip is a transmission filter chip and the another elastic wave filter chip is a reception filter chip.

13. The elastic wave device described in claim 1, wherein the elastic wave filter chip is a transmission filter chip including a piezoelectric substrate and an electrode structure on the piezoelectric substrate, and the electrode structure includes interdigital transducer electrodes and reflectors defining series arm resonators and parallel arm resonators, a series arm, parallel arms, a plurality of signal terminals and ground terminals.

14. The elastic wave device described in claim 1, wherein the elastic wave filter chip is a reception filter chip including a piezoelectric substrate and an electrode structure on the piezoelectric substrate, and the electrode structure includes interdigital transducer electrodes and reflectors defining longitudinally coupled resonator filter units, one-port surface acoustic resonators, a plurality of signal terminals and ground terminals.

15. The elastic wave device described in claim 1, wherein the common connection wiring line is a reception internal electrode provided at an intermediate layer of the wiring board.

16. The elastic wave device described in claim 1, wherein the wiring board includes an upper layer and a lower layer, an upper surface of the upper layer defines the die-attach surface, an surface of the lower layer defines an intermediate surface of the wiring board, a bottom surface of the lower layer defines a bottom surface of the wiring board, each of the die-attach surface, the intermediate surface and the bottom surface include an electrode structure.

17. The elastic wave device described in claim 16, wherein the electrode structure on the die-attach surface includes an antenna electrode, a transmission electrode, reception electrodes and ground electrodes.

18. The elastic wave device described in claim 16, wherein the electrode structure on the intermediate surface includes an antenna internal electrode, a reception internal electrode, and ground internal electrodes.

19. The elastic wave device described in claim 16, wherein the electrode structure on the die-attach surface includes an antenna external electrode, a transmission external electrode, a reception external terminal and ground external terminals.

20. A cellular phone comprising the elastic wave device described in claim 1.

21. An elastic wave device comprising:
a wiring board including a die-attach surface; and
an elastic wave filter chip mounted on the die-attach surface of the wiring board; wherein
the elastic wave filter chip includes an input, an output, and a plurality of elastic wave filters connected between the input and the output; wherein
the input includes a plurality of input signal terminals each connected to a respective one of the plurality of elastic wave filters;
the output includes a plurality of output signal terminals each connected to a respective one of the plurality of elastic wave filters;
a common connection wiring line is provided on or in the wiring board and outside of the elastic wave filter chip; wherein
the common connection wiring line commonly connects, in parallel, the plurality of input signal terminals outside of the elastic wave filter chip.

\* \* \* \* \*